(12) United States Patent
Kuzmenka

(10) Patent No.: US 7,047,334 B2
(45) Date of Patent: May 16, 2006

(54) DEVICE FOR SUPPLYING CONTROL SIGNALS TO MEMORY UNITS, AND A MEMORY UNIT ADAPTED THERETO

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 406 days.

(21) Appl. No.: 10/302,214

(22) Filed: Nov. 22, 2002

(65) Prior Publication Data

US 2003/0101296 A1 May 29, 2003

(30) Foreign Application Priority Data

Nov. 26, 2001 (DE) ................................ 101 57 874

(51) Int. Cl.
*G06F 13/00* (2006.01)
*G06F 13/14* (2006.01)
*G06F 13/36* (2006.01)

(52) U.S. Cl. ........................ 710/104; 710/305; 710/310

(58) Field of Classification Search ................ 710/305, 710/104, 310; 714/5

See application file for complete search history.

(56) References Cited

U.S. PATENT DOCUMENTS

| | | | | |
|---|---|---|---|---|
| 5,157,635 A | * | 10/1992 | Ellis et al. | 365/230.06 |
| 6,449,213 B1 | * | 9/2002 | Dodd et al. | 365/233 |
| 6,480,946 B1 | * | 11/2002 | Tomishima et al. | 711/167 |
| 2003/0062922 A1 | * | 4/2003 | Douglass et al. | 326/39 |
| 2004/0221083 A1 | * | 11/2004 | Liaw et al. | 710/305 |

* cited by examiner

*Primary Examiner*—Rehana Perveen
*Assistant Examiner*—Jeremy S. Cerullo
(74) *Attorney, Agent, or Firm*—Laurence A. Greenberg; Werner H. Stemer; Ralph E. Locher

(57) ABSTRACT

A device for supplying control signals to memory units of a memory module comprises a first bus section for supplying a first part of the control signals to a first memory unit. In addition, a second bus section is provided for supplying a second part of the control signals to a second memory unit. Finally, the device comprises redrive means for redriving the first part of the control signals from the first memory unit to the second memory unit and for redriving the second part of the control signals from the second memory unit to the first memory unit. A memory unit for such a device for supplying control signals comprises first inputs for receiving a first part of the control signals from a memory control, second inputs for receiving a second part of the control signals from at least one other memory unit, and outputs for redriving said first part of the control signals to said at least one other memory unit.

16 Claims, 3 Drawing Sheets

DEVICE FOR SUPPLYING CONTROL SIGNALS TO MEMORY UNITS, AND A MEMORY UNIT ADAPTED THERETO

BACKGROUND OF THE INVENTION

1. Field of the Invention

The present invention relates to a device for supplying control signals to memory units of a memory module, and, in particular, to a device which is suitable for supplying command/address signals to memory chips arranged on a memory module. In addition, the present invention relates to a memory unit adapted to such a device, in particular a memory unit which is used as memory chip of a memory module.

2. Description of the Related Art

Conventional memory modules consist of a plurality of memory chips which are arranged on a common board and which form a memory module. For accessing the individual memory chips, command/address buses and data buses are provided in addition to suitable clock lines. Conventional DRAM memory modules (DRAM=Dynamic Random Access Memory), for example, have such a configuration. Both data signals and control signals are supplied to the memory module making use of an external memory control, the so-called chipset.

In a memory module configuration of the above-mentioned type, the data rate on the command/address bus is limited due to the high input capacitance of the DRAM memory chips, the buses leading to the DRAM memory chips having great line lengths so that a separate register/buffer chip is necessary for accessing the DRAM memory chips via the command/address bus. It follows that in existing memory architectures an extra register is necessary for driving the command/address bus. The problems referred to especially arise, to a greater degree, in the case of memory modules with high access rates and access frequencies, e.g. DDR memory modules (DDR=Double Data Rate), which are normally constructed as DIMM architecture (DIMM=Dual In-line Memory Module).

In order to solve the above-mentioned problem, it has hitherto been common practice to use more than one command/address bus copy on the mother board level. For an un-buffered DDR333 two-slot system, one C/A bus copy per slot (mounting location) can, for example, be used for a total number of two C/A bus copies (C/A=Command/Address). Alternatively, two copies of command/address buses (C/A buses) were used in the memory module comprising separate memory registers or one memory register with divided outputs for solving the above problem.

SUMMARY OF THE INVENTION

It is the object of the present invention to provide a device for supplying control signals to memory units of a memory module, and a memory unit adapted thereto, said device and said memory unit permitting rapid, reliable accessing of the memory units with high transmission rates.

The present invention is a device for supplying control signals to memory units of a memory module, having:

a first bus section for supplying a first part of the control signals to a first memory unit;

a second bus section for supplying a second part of the control signals to a second memory unit, and redrive means for redriving the first part of the control signals from the first memory unit to the second memory unit and for redriving the second part of the control signals from the second memory unit to the first memory unit.

The present invention additionally provides a memory unit which is adapted to be accessed making use of control signals, comprising:

first inputs for receiving a first part of the control signals from a memory control;

second inputs for receiving a second part of the control signals from at least one other memory unit; and outputs for redriving said first part of the control signals to said at least one other memory unit.

The present invention is particularly suitable for realizing a new kind of command/address bus architecture (C/A bus architecture) for memory modules and, in particular, for DRAM memory modules. In the case of conventional C/A bus architectures, each memory chip has supplied thereto via a C/A bus C/A signals with a predetermined number of positions, i.e. number of bit positions, e.g. 24 positions. Each memory chip receives all the positions of the C/A signals from the C/A bus.

The present invention is based on the finding that an advantageous C/A bus architecture can be achieved, when each memory chip has supplied thereto only part of the C/A signals via a bus section from a memory control, whereas the residual parts of the C/A signals are redriven between the memory units. In the case of a conventional C/A bus width of 24 bits, i.e. 24 positions, a first memory chip can, for example, receive the first eight positions of the C/A signals, a second memory chip the second eight positions and a third memory chip the third eight positions. Making use of suitable mechanisms, the first memory chip then redrives the first eight positions to the second and third memory chips. In the same way, the second memory chip redrives the second eight positions to the first and third memory chips, whereas the third memory chip redrives the third eight positions to the first and second memory chips. The above-mentioned three memory chips can therefore be regarded as a group of memory chips, said group of memory chips having 24 inputs, i.e. each of said memory chips has eight inputs for receiving eight positions, so as to receive the 24-position C/A signals. Between the memory chips of the above-mentioned group, a redrive bus having a bus width of 24 bits is preferably provided, which is connected to respective inputs and outputs of the memory chips of the group so as to realize the above-explained redrive operations.

A memory module has preferably provided thereon a plurality of the above-described groups of memory chips, each of these groups receiving via a bus having a respective bit width the C/A signals with the corresponding number of positions, so that a copy of a "C/A bus" whose bit width corresponds to the number of positions of the C/A signals is provided for each group.

In order to realize the above-described redrive between the memory chips of a group, the individual memory chips have preferably provided thereon drivers for driving respective outputs, which are connected to inputs of the other memory chips of the group. Such drivers can e.g. be registers or buffers of the type normally provided on the memory module board, so as to drive a whole C/A bus.

Since, according to the present invention, not each individual memory chip receives all the positions of the C/A signals, it is possible to transmit to the memory chips the respective part of the C/A signals via the data bus, which is typically a bus having less positions, e.g. an 8-bit bus. Data signals and control signals, i.e. command/address signals, are then transmitted in multiplex via the same bus; according to the present invention, a time multiplex can preferably be used. In such a case, a multiplexer for multiplexing the data signals and the control signals onto the bus is provided in the memory control, the so-called chipset, whereas a means for demultiplexing the data signals and the control signals is provided in the respective memory chips.

The new architecture of the control-signal busses, especially of the command/address bus of DRAM memory modules, according to the present invention permits a reduction of signal displacement and an increase in the transmission rate on the command/address bus in the memory module. The present invention makes it possible to drive the command/address bus at double data rate, i.e. the same data rate at which the data bus is driven. In addition, the architecture according to the present invention permits a reduction of the number of connections of the memory module, since not each individual memory chip receives all the positions of the command/address signals. In view of the improved topology, the present invention permits the reduction of layers in the printed module board. Furthermore, a separate register or buffer IC (IC=integrated circuit) can be dispensed with, when register or buffer drivers are provided on the respective circuit chips so as to realize the redrive of parts of the C/A signals between the circuit chips.

BRIEF DESCRIPTION OF THE DRAWINGS

In the following, preferred embodiments of the present invention will be explained in detail making reference to the drawings enclosed, in which.

DESCRIPTION OF PREFERRED
EMBODIMENTS OF THE INVENTION

Making reference to the figures enclosed, the present invention will be explained in detail in the following on the basis of command/address bus and data bus architectures for a DRAM memory module in the case of which C/A signals having a width of 24 bits and data signals having a width of 8 bits are used. It is, however, clear that the present invention can also be used for other memory architectures with control signals and data signals having other bit widths.

Figure 1:
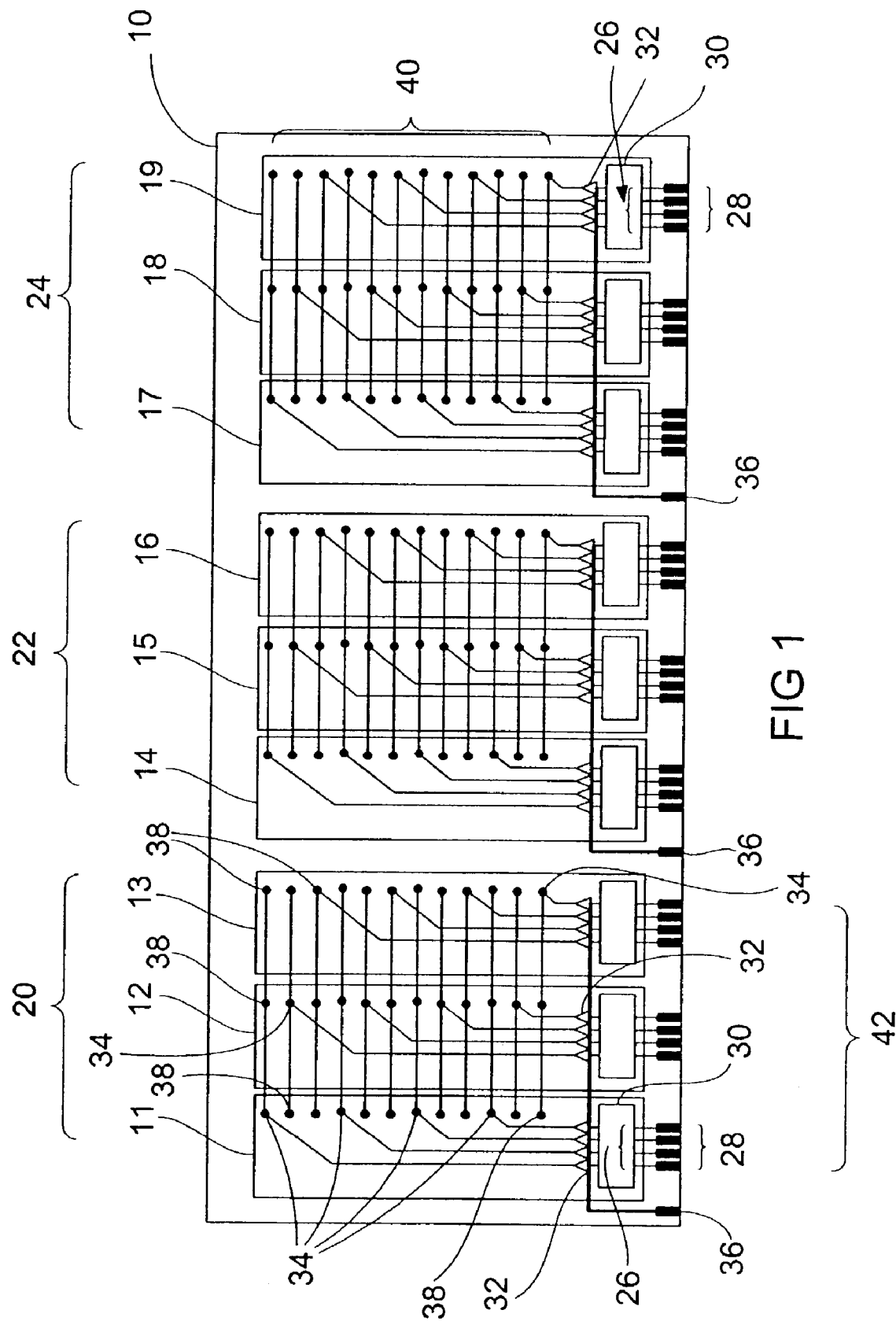
FIG. 1 shows a schematic representation of a first embodiment of a bus architecture according to the present invention.

As can be seen in FIG. 1, a memory module 10 comprises nine memory chips 11 to 19. The memory chips 11 to 13 form a first group 20, the memory chips 14 to 16 form a second group 22 and the memory chips 17 to 19 form a third group 24. Each memory cell 11 to 19 has eight first inputs, the first inputs of the memory chips 11 and 19 being exemplarily designated by reference numeral 26. It should here be pointed out that, for the sake of clarity, only four of the respective inputs 26 cell are shown in the figures. Similarly, the figures show, again for the sake of clarity, only half of the additional inputs, outputs, bus lines and bus line drivers described hereinbelow.

In the embodiment shown, the inputs 26 represent the data inputs of the memory chips in question which are connected to a respective data bus 28 having an 8-bit organization.

The inputs 26 of each memory chip are connected to a demultiplexer 30, which will be explained in detail hereinbelow. Eight outputs of the demultiplexer 30 have driver means 32 connected thereto, which are provided for driving eight C/A outputs of the respective memory chips, the C/A outputs of the memory chip 11 being designated by reference numeral 34. The driver means 32 may be buffer drivers or register drivers having a configuration which is normally used for driving a bus line and which makes use e.g. of a clock-pulse controlled flip-flop and of a post-connected amplifier. Respective lines for supplying a strobe signal for synchronizing the drivers 32 are designated by reference numeral 36 in FIG. 1.

The outputs 34 of the memory chip 11 are connected to respective second inputs of the memory chips 12 and 13, two of these second inputs being exemplarily designated by reference numeral 38 in FIG. 1. Similarly, the C/A outputs of this memory chip, which are driven by the drivers 32 of the memory chip 12, are connected to respective second inputs 38 of the memory chips 11 and 13. Finally, respective outputs 34 of the memory chips 13 are connected to respective second inputs 38 of the memory chips 11 and 12 in a corresponding manner.

The above description of the connections of the memory chips 11 to 13 defining the first group 20 applies, analogously, to the memory chips 14 to 16 defining the second group 22 and the memory chips 17 to 19 defining the third group 24.

On the basis of the described connections of the C/A outputs of each memory chip to the respective second inputs of the other memory chips of the same group, the structure of group-internal C/A buses 40, which is shown in FIG. 1, is obtained for each group 20, 22 and 24. Each group-internal C/A bus 40 has a width of 24 bits, each bit line of the group-internal C/A buses 40 being connected to a respective C/A output 34 and two respective second inputs 38. It follows that eight C/A outputs 34 and sixteen second inputs 38 of each memory chip 11 are connected to the respective group-internal C/A bus. For obtaining a topology which is as symmetrical as possible, the group-internal C/A buses 40 have preferably a parallel configuration of the type shown in FIG. 1.

Making use of the architecture described hereinbefore with reference to FIG. 1, the respective memory chips 11 to 19 have supplied thereto control signals in the form of C/A signals as well as data signals making use of the data buses 28. The C/A signals for the memory chips 11 to 13 are supplied via the three data buses 28 of these three memory chips defining the first group 20. Likewise, the C/A signals for the memory chips 14 to 16, which define the second group 22, and the memory chips 17 to 19, which define the third group 24, are supplied via the respective data lines of the chips belonging to the group in question. In the following, the further mode of operation will be explained only on the basis of the first group 20; it is, however, clear that the explanations apply analogously to the second group 22 and the third group 24.

As has been explained hereinbefore, each of the data buses 28 comprises eight bits so that the data lines of the three memory chips 11, 12 and 13, which define the first group 20, comprise 24 bits in common, so that, via a composite bus 42, which is defined by the three data buses 28, 24-position C/A signals can be supplied to the first group 20. The first memory chip 11 receives in this case the first eight positions of the C/A signals at its inputs 26, memory 12 receives the middle eight positions at the respective inputs thereof, and the memory chip 13 receives the last eight positions of the C/A signals also at the respective inputs thereof. The first memory chip 11 outputs via the drivers 32 the first eight positions of the C/A signals so that they are redriven via the group-internal C/A bus 40 to the second inputs 38 of the memory chips 12 and 13. Similarly, memory chip 12 outputs the middle eight positions of the C/A signals via its outputs 34, whereas memory chip 13 outputs the last eight positions of the C/A signals via its outputs 34. It follows that each memory chip 11, 12 and 13 receives via its first inputs 26 and its second inputs 38 all 24 positions of the C/A signals so that each memory chip receives the control signals required for adequate accessing.

In addition to the above-mentioned positions of the C/A signals, the respective data buses 28 transmit also the data signals to the memory chips. For this purpose, the memory control (chipset) (not shown) includes a multiplexer implementing the transmission of the two signal types in a time multiplex mode via the data bus 28. Furthermore, the memory control must drive three copies of the composite bus 42, which represents an "external C/A bus", i.e. a total of 72 bits. For this purpose, the memory control can be provided with a suitable number of outputs, or a suitable branch can be provided outside of the memory control.

In the demultiplexer 30, the C/A signals and the data signals, which are received via the same data bus 28, are differentiated. The simplest form of this demultiplexing can take place in that separate strobe signals (take-up signals) are provided for the C/A signals on the one hand and the data signals on the other. For the data signals, the conventional bidirectional BDQS strobe signal, which is used in double-data-rate systems (DDR systems), can be used. Furthermore, a separate strobe signal, which can e.g. be referred to as C/A-bus strobe signal, is supplied via the strobe-signal lines 36 for activating the driver means 32. This signal is, however, a unidirectional signal from the memory control to the memory module, i.e. the individual memory chips. In the demultiplexers 30, the eight signals received via the data bus 28 are simultaneously connected to the I/O stages (I/O=input/output) of the respective memory chip, if the data strobe signal in question is active. Otherwise, the respective input signals are redriven via the driver means 32 to the outputs 34 and, consequently, to the group-internal C/A bus 40, if the respective C/A-bus strobe signal is active. In short, this means that, if the data strobe signal is active, data will be written into or read from the memory, whereas, if the C/A-bus strobe signal is active, data will be transmitted via the drivers 32, the outputs 34, the group-internal C/A buses 40 and the second inputs 38 to the other memory chips of a respective group. This means that the signals received are here switched over between the chip-internal data lines and the group-internal C/A bus making use of suitable strobe signals, whereby the signals transmitted via the data buses in a time multiplex are demultiplexed.

In addition to the C/A-bus strobe signal described, it is also possible to use reserved bit combinations on the data bus for synchronizing the group-internal C/A bus, i.e. for redriving the C/A signals onto said group-internal C/A bus.

In the embodiment which has been described hereinbefore with reference to FIG. 1, the C/A signals and the data signals are thus transmitted via the same data bus, each memory chip having a buffer or a register so as to drive C/A signals received via the data bus onto the group-internal C/A bus. The chips are subdivided into groups comprising each three elements; each of these elements receives only a part, i.e. a certain number of positions, of the C/A signals from the memory control, whereas the other parts are received by the other memory chips of the same group.

For this purpose, it must be determined which of the pins of the respective memory chips, which are connected by the group-internal C/A bus, represent transmitters (outputs 34) or receivers (second inputs 38). This option can be programmed e.g. by a master register during an initialization process. Another possibility is that each memory chip is provided with an additional pin (not shown) which has connected thereto a certain potential, e.g. GND, VDD or Vref. Such an additional pin of memory chip 11 may, for example, have connected thereto the potential GND for indicating that memory chip 11 drives the first eight bits of the C/A signals onto the group-internal C/A bus 40. The additional pin of memory chip 12 may have connected thereto VDD for indicating that this memory chip drives the eight middle bits of the C/A signals onto the group-internal C/A bus 40. Finally, the additional pin of memory chip 13 may be connected to the potential Vref for indicating that this chip drives the last third of positions of the C/A signals onto the group-internal C/A bus 40. It follows that, by connecting the additional pin to three different potentials, it can be indicated and defined which memory chip serves as a driver for which positions, i.e. lines of the group-internal C/A bus 40. The connection of such an additional pin can easily be implemented on the board of the memory module.

For synchronizing e.g. the above-mentioned demultiplexing, normal clock signals can be used so that in the architecture according to the present invention the clock topology can be the same as in the case of conventional DDR1 architectures making use of a phase locked loop or making use of a copy of the clock signal (CLK signal) per group of memory chips. In addition, chip selection signals (CS signals) can be used in a conventional manner. Alternatively, reserved combinations of data bits, which the internal logic will recognize as a CS signal for a given chip, can be used on the data bus, e.g. a bit combination of 11111111. In this case, it will be necessary to carry out a previous assignment of numbers, and to number the memory chips so as to recognize the respective bit combination associated therewith. In addition, the data combinations used for said numbering must be excluded from valid data. Furthermore, separate CS signal pins can be provided, each group of memory chips having then supplied thereto a copy of the CS signal, so that in the embodiment described three copies exist per memory module. The copy of the CS signal received by each group is distributed to every chip of the group. It follows that only three CS pins are required for the memory module, each of these CS pins being capacitively loaded with three memory chips. Such a solution is advantageous, since an excessively large number of CS pins would have to be provided, if such a pin were provided for each individual chip. Otherwise, an excessively high capacitive load with resultant poor behaviour would exist, if the module had only one CS pin which would branch to the individual memory chips.

Figure 2:
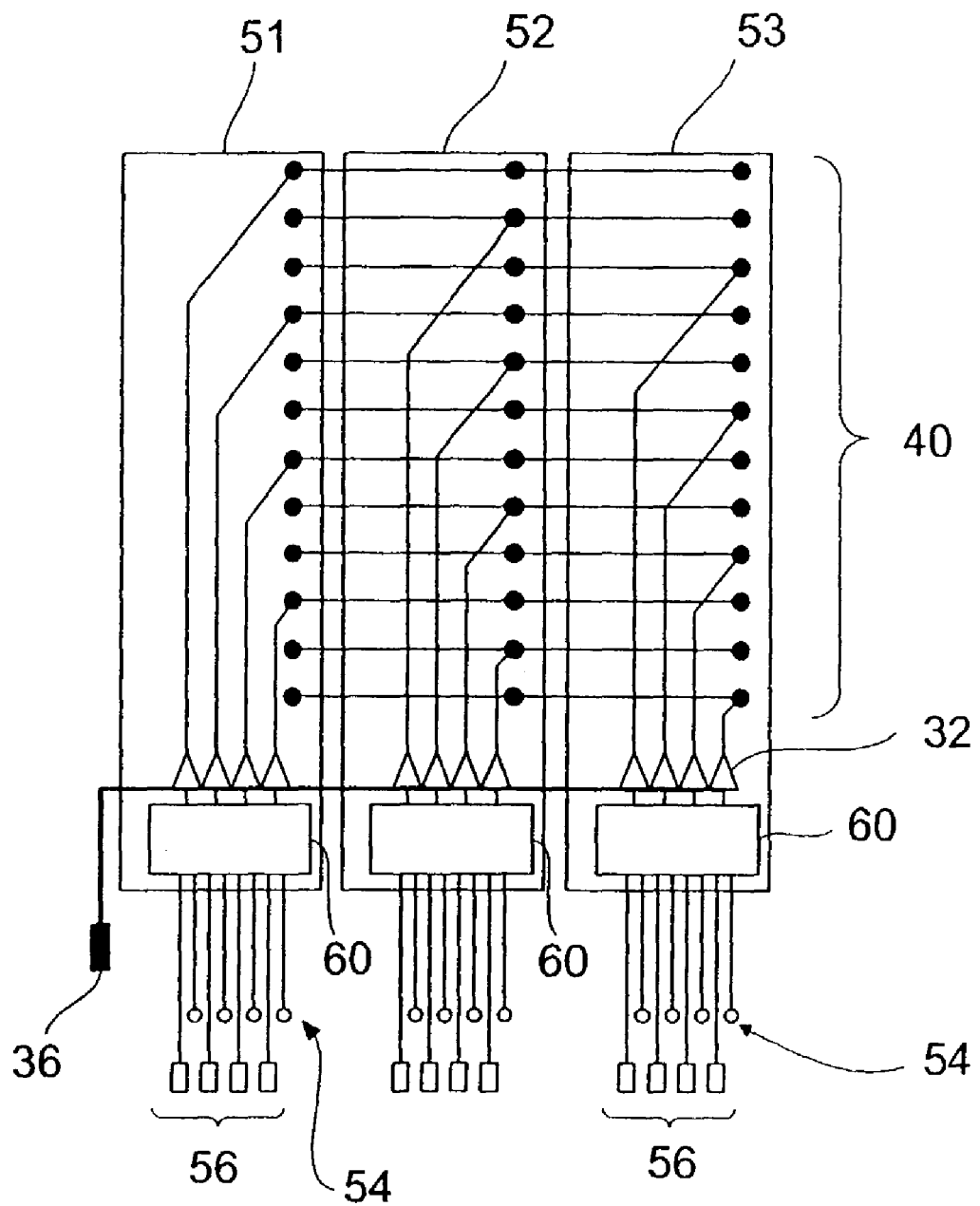
FIG. 2 shows a schematic representation of a second embodiment of a bus architecture according to the present invention.

FIG. 2 shows an alternative embodiment of an architecture according to the present invention in which only a group of memory chips 51, 52 and 53 is shown; the memory module may, however, again consist of nine memory chips by way of example. The embodiment shown in FIG. 2 differs from the embodiment described with reference to FIG. 1 insofar as the C/A signals are supplied from a memory control via a separate C/A bus, but not via the data bus. In this case, each memory chip 51, 52 and 53 has eight data inputs, which are connected to respective data buses 54, and eight C/A inputs which are connected to respective data buses 56. FIG. 2 shows again only half the number of inputs, outputs, bus positions and bus lines, respectively, for the sake of clarity. Like the memory chips described with reference to FIG. 1, the memory chips 51, 52 and 53 comprise respective C/A outputs and second inputs which are interconnected so as to implement the group-internal C/A bus. In the example of FIG. 2, a demultiplexer is not necessary, but the respective block 60 of the memory chips represents here an input/output interface in which the data inputs are coupled to respective chip-internal data lines and the C/A-signal inputs are coupled to the drivers 32 whose operation is, in turn, synchronized by strobe signals supplied via the line 36.

Alternatively to the embodiments described hereinbefore with reference to FIGS. 1 and 2, it is possible to use programmable memory cells having a number of C/A inputs which corresponds to the number of positions of a C/A input bus. Such memory cells would be programmable insofar as, in cases in which the architecture according to the present invention is implemented, only part of the C/A inputs would be used for receiving part of the positions of the C/A signals, whereas in cases in which a conventional memory topology is implemented all the C/A inputs would be used, so that the topology of the C/A bus is the same as that of the existing architecture of registered DDR modules. It follows that memory cells of this kind can be used both for conventional architectures and for the architecture according to the present invention.

The present invention has a plurality of advantages. For example, each C/A output of the individual memory cells is only connected to a small number of inputs, in the embodiment shown only two inputs. On the basis of the shortened post-register networks, which, in comparison with existing topologies of DDR1 systems, are approximately three to four times shorter, it is possible to implement higher frequencies and/or a C/A signal transmission with double data transmission rates. In addition, a reduced number of layers of the memory-module board is required; an additional memory register chip can be dispensed with. Furthermore, 21–24 C/A pins can be removed from the memory connector.

Figure 3:
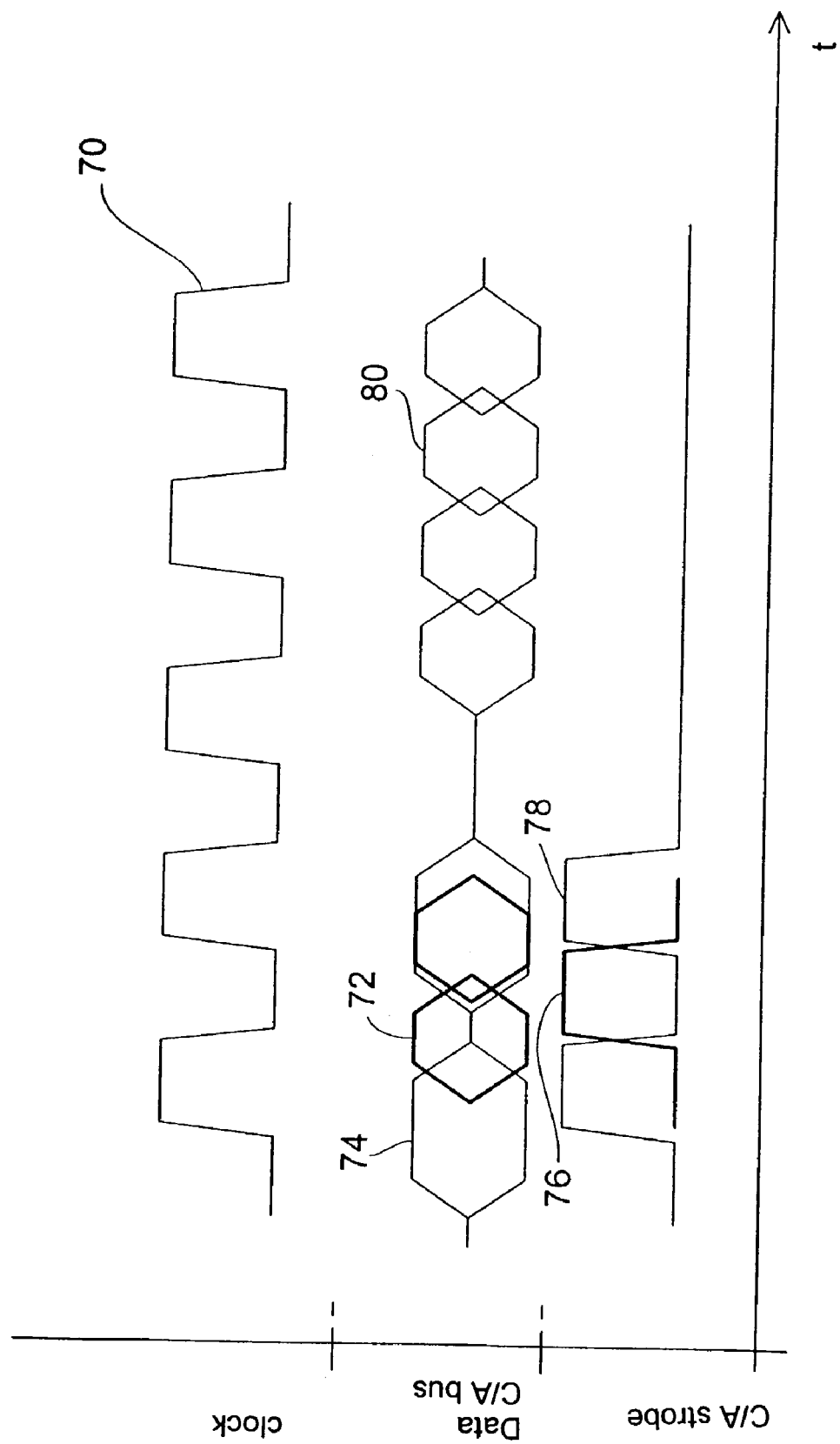
FIG. 3 schematically shows signal profiles of the type which may occur when a memory chip is accessed in the case of an embodiment of the present invention.

Exemplary signals for a transmission of data signals and C/A signals via a data bus in a time multiplex for single data transmission rates and double data transmission rates are shown in FIG. 3. A clock signal 70 serves to synchronize the respective signal transmissions. Among the signals present on the data C/A bus, the thickly printed C/A signals 72 represent signals with double transmission rates, whereas the less thickly printed C/A signals 74 represent signals with single transmission rates. These C/A signals 72 and 74 are recognized as such by respective strobe signals 76 and 78, which are also shown in a thickly printed and in a less thickly printed form. Furthermore, data signals 80, which are transmitted via the data C/A bus, are shown in FIG. 3; these data signals are recognized as such, since no strobe signal is active on the C/A bus strobe line. As can be seen from the clock pulse edges shown in FIG. 3, the C/A signals 74 with single transmission rate are stored intermediately (latched) only in the case of the rising edge of the clock or strobe signal, whereas C/A signals 72 with double transmission rates are intermediately stored in the case of rising and falling edges, i.e. in the case of two transitions per clock period.

What is claimed is:

1. A device for supplying control signals to memory units of a memory module, comprising:
    n bus sections, n being an integer greater than 1, for supplying n parts of the control signals to n memory units;
    redrive means for redriving the part of the control signals supplied to a respective memory unit to the other memory units;
    the n memory units forming a group and the n bus sections defining together a group bus having a number of positions corresponding to the number of positions of the control signals;
    each memory unit including first inputs for receiving the part of the control signals from the associated bus section, second inputs for receiving the redriven parts of the control signals from the other memory units, and outputs for redriving the part of the control signals received from the associated bus section; and
    means for configuring which pins of the memory unit serve as the second inputs and which pins of the memory unit serve as the outputs.

2. The device according to claim 1 for supplying control signals to a plurality of groups of memory unites, wherein a copy of the group bus is provided for each group.

3. The device according to claim 1, wherein the redrive means is provided with a group-internal connection bus connecting the outputs of each memory unit of a group to the second inputs of the other memory units of the group.

4. The device according to claim 1, wherein the redrive means comprises drivers formed on the memory units and used for driving the outputs of the memory units.

5. The device according to claim 4, wherein the drivers comprise registers or buffers.

6. The device according to claim 1, wherein the bus sections are formed by data buses which are connected to the memory units.

7. The device according to claim 6, wherein each memory unit includes a means for demultiplexing data signals and control signals transmitted via the data buses.

8. The device according to claim 1, wherein the memory units are memory chips.

9. The device according to claim 1, wherein the control signals are command/address signals.

10. A memory unit adapted to be accessed making use of control signals, comprising:
    first inputs for receiving a first part of the control signals from a memory control;
    second inputs for receiving a second part of the control signals from at least one other memory unit;
    outputs and redrive means for redriving said first part of the control signals to said at least one other memory unit; and
    means for configuring which pins of the memory unit serve as said second inputs and which pins of the memory unit serve as said outputs.

11. The memory unit according to claim 10, comprising drivers for driving the outputs.

12. The memory unit according to claim 11, wherein said drivers comprise registers or buffers.

13. The memory unit according to claim 10, which is defined by a memory chip.

14. The memory unit according to claim 10, which additionally comprises a means for demultiplexing first parts of the control signals received at the first inputs and data signals received at said first inputs.

15. The memory unit according to claim 10, wherein the control signals are command/address signals.

16. The memory unit according to claim 10, wherein said means for configuring determines, in dependence upon a potential applied to a pin which is provided for this purpose, which pins of the memory unit serve as said second inputs and which pins of the memory unit serve as said outputs.

* * * * *